United States Patent [19]

Gardner et al.

[11] Patent Number: 5,918,133
[45] Date of Patent: Jun. 29, 1999

[54] SEMICONDUCTOR DEVICE HAVING DUAL GATE DIELECTRIC THICKNESS ALONG THE CHANNEL AND FABRICATION THEREOF

[75] Inventors: Mark I. Gardner, Cedar Creek; Robert Paiz, Austin, both of Tex.

[73] Assignee: Advanced Micro Devices, Austin, Tex.

[21] Appl. No.: 08/993,029

[22] Filed: Dec. 18, 1997

[51] Int. Cl.[6] .................. H01L 21/31; H01L 21/3115
[52] U.S. Cl. .................. 438/299; 438/423; 438/520; 438/766
[58] Field of Search .................. 438/264, 258, 438/703, 299, 423, 520, 766

[56] References Cited

U.S. PATENT DOCUMENTS

| 4,642,881 | 2/1987 | Matsukawa et al. | 438/264 |
|---|---|---|---|
| 4,651,406 | 3/1987 | Shimizu et al. | 438/258 |
| 5,254,489 | 10/1993 | Nakata | 438/258 |
| 5,316,981 | 5/1994 | Gardner et al. | 438/703 |
| 5,330,920 | 7/1994 | Soleimani et al. | 438/703 |
| 5,352,618 | 10/1994 | Larsen et al. | 438/703 |
| 5,498,577 | 3/1996 | Fulford, Jr. et al. | 438/703 |
| 5,501,996 | 3/1996 | Yang et al. | 438/264 |

Primary Examiner—Olik Chaudhuri
Assistant Examiner—William David Coleman
Attorney, Agent, or Firm—Merchant, Gould, Smith, Edell, Welter & Schmidt, P.A.

[57] ABSTRACT

Generally, the present invention relates to a semiconductor device having a dual thickness gate dielectric along the channel and a process of fabricating such a device. By providing a dual thickness gate dielectric, the gate dielectric can, for example, be optimized to the transistor and device performance can be enhanced.

16 Claims, 4 Drawing Sheets

5,918,133

SEMICONDUCTOR DEVICE HAVING DUAL GATE DIELECTRIC THICKNESS ALONG THE CHANNEL AND FABRICATION THEREOF

FIELD OF THE INVENTION

The present invention is directed generally to semiconductor devices, and more particularly to a semiconductor device having a dual gate dielectric thickness along the channel and process of fabricating such a device.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

The principal elements of a typical MOS semiconductor device are illustrated in FIG. 1. The device generally includes a gate electrode 101, which acts as a conductor, to which an input signal is typically applied via a gate terminal (not shown). Heavily doped source 103 and drain 105 regions are formed in a semiconductor substrate 107 and are respectively connected to source and drain terminals (not shown). A channel region 109 is formed in the semiconductor substrate 107 beneath the gate electrode 101 and separates the source 103 and drain 105 regions. The channel is typically lightly doped with a dopant type opposite to that of the source 103 and drain 105 regions. The gate electrode 101 is physically separated from the semiconductor substrate 107 by an insulating layer 111, typically an oxide layer such as $SiO_2$. The insulating layer gate dielectric 111 is provided to prevent current from flowing between the gate electrode 101 and the semiconductor source region 103, drain region 105 or channel region 109.

In operation, an output voltage is typically developed between the source and drain terminals. When an input voltage is applied to the gate electrode 101, a transverse electric field is set up in the channel region 109. By varying the transverse electric field, it is possible to modulate the conductance of the channel region 109 between the source region 103 and drain region 105. In this manner an electric field controls the current flow through the channel region 109. This type of device is commonly referred to as a MOS field-effect-transistors (MOSFET).

Semiconductor devices, like the one described above, are used in large numbers to construct most modern electronic devices. In order to increase the capability of such electronic devices, it is necessary to integrate even larger numbers of such devices into a single silicon wafer. As the semiconductor devices are scaled down (i.e., made smaller) in order to form a larger number of devices on a given surface area, the structure of the devices and fabrication techniques used to make such devices must be altered.

One important step in the manufacture of MOS devices is the formation of the gate dielectric. The gate dielectric is typically an oxide layer which is grown in active regions of the device. In order to obtain a high-quality gate oxide layer, the surface of the active area is often wet-etched to remove any residual oxide. The gate oxide layer is then grown slowly, typically through dry oxidation. It is important to carefully control the growth of the gate oxide layer because the thickness and uniformity of the gate oxide layer can significantly impact the overall operation of the device being formed. For example, the drive current in a MOS transistor is inversely proportional to the gate-oxide thickness at a given set of terminal voltages. Accordingly, it is normally desired to make the gate oxide as thin as possible, taking into consideration the reliability considerations (e.g., hot carrier injection resistance) of the gate oxide.

SUMMARY OF THE INVENTION

Generally, the present invention relates to a semiconductor device having a dual thickness gate dielectric along the channel and a process of fabricating such a device. By providing a dual thickness gate dielectric, the gate dielectric can, for example, be optimized to the transistor and device performance can be enhanced.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
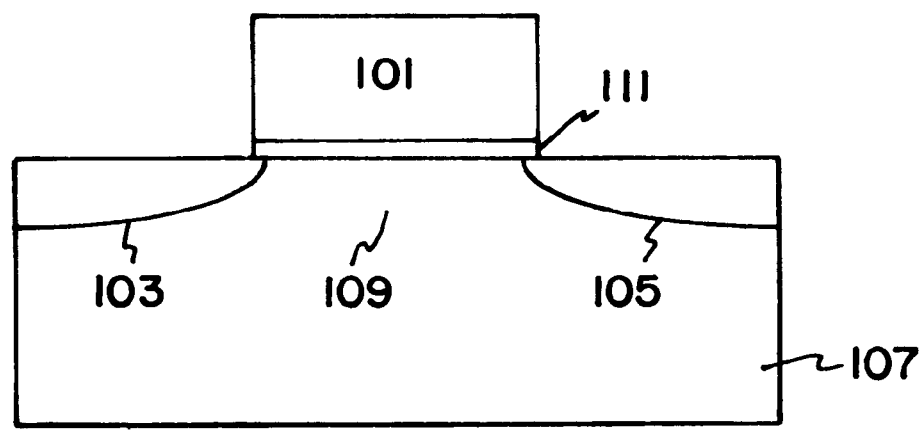
FIG. 1 illustrates a conventional MOS device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices which have gate electrodes separated from a substrate by a gate insulating layer. Such semiconductor devices include, for example, MOS, CMOS, and BiCMOS devices. While the present invention is not so limited, an appreciation of various aspects of the invention is best gained through a discussion of various application examples of processes used to form such semiconductor devices.

FIGS. 2A–2F illustrate the process for fabricating a semiconductor device having a dual thickness gate dielectric along the channel of a gate electrode. In accordance with this process, masking layer 203 such as an oxide layer is formed over a substrate 201, typically a silicon substrate. The masking layer 203 may be formed using, for example, well-known deposition techniques. The masking layer 203 will be used to form a gate electrode stack (i.e., a gate electrode and a gate dielectric). The thickness of the masking layer 203 is suitably selected in consideration of the desired thickness of the gate electrode stack. Suitable thicknesses for the masking layer 203 range from about 1,000 to 3,000 Å for many applications.

Figure 2A:
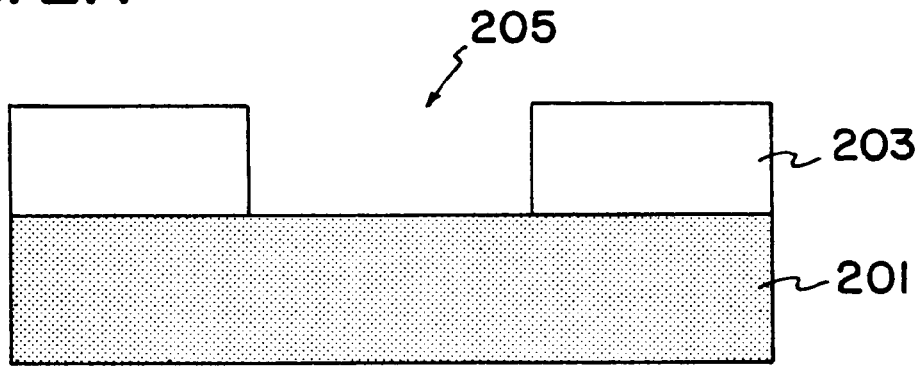
FIGS. 2A through 2E illustrate a fabrication process in accordance with an embodiment of the invention.

Portions of the masking layer 203 are removed to form one or more openings (only one of which shown) exposing the substrate 201. As will be discussed below, a gate electrode stack will be formed in the opening 205. The resultant structure is illustrated in FIG. 2A. The opening 205 in the masking layer 203 may be formed using, for example, well-known photolithography and etching techniques.

The gate electrode stack will be formed in the opening 205. The width of the opening 205 is suitably selected in consideration of the desired width of the gate electrode stack. Suitable widths range from about 0.1 to 0.25 microns for many applications.

Figure 2B:
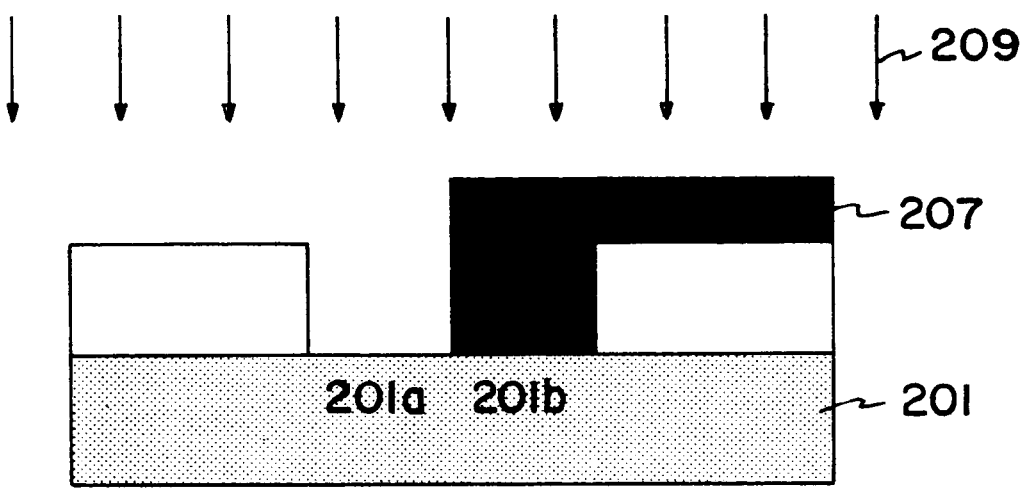

A mask 207 is formed to selectively expose only a portion of the substrate 201 within the opening 205. The mask 207 may be formed, for example, by depositing a layer of photoresist and selectively developing the photoresist to form the mask 207, as illustrated in FIG. 2B. This may be done using, for example, well-known photolithography techniques.

As will be discussed further below, the exposed portion 201a of the substrate 201 will be used to form a portion of a gate dielectric having one thickness and the covered portion 201b of the substrate 201 in the opening 205 will be used to form the remaining portion of the gate dielectric with a different thickness. The amount of the opening 205 covered by the mask layer 207 depends on the relative desired lengths of the two portions of the gate dielectric. In the exemplary embodiment, about one-half of the opening 205 is covered by the mask 207.

With the mask 207 in place, a nitrogen bearing-species 209 is implanted into the exposed portion 201a of the substrate 201. The nitrogen implant will be used to form a relatively thin gate dielectric in the exposed portion 201a of the substrate 201. The nitrogen-bearing species 209 may be, for example, one or more of the following N, $N_2$, NO, or $NF_3$, for example. Suitable implantation energies and dosages for a nitrogen implant range from about 1 to 30 keV and 1E13 ($1\times10^{13}$) to 6E15 ($6\times10^{15}$) atoms/$cm^2$, respectively, for many applications.

Figure 2C:
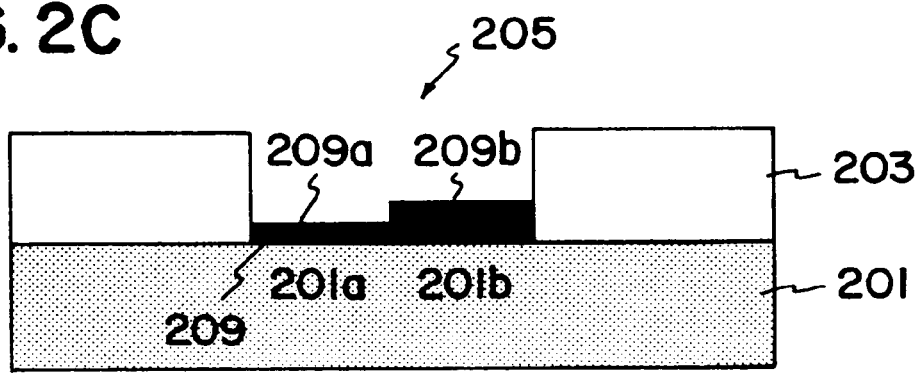
Figure 2D:
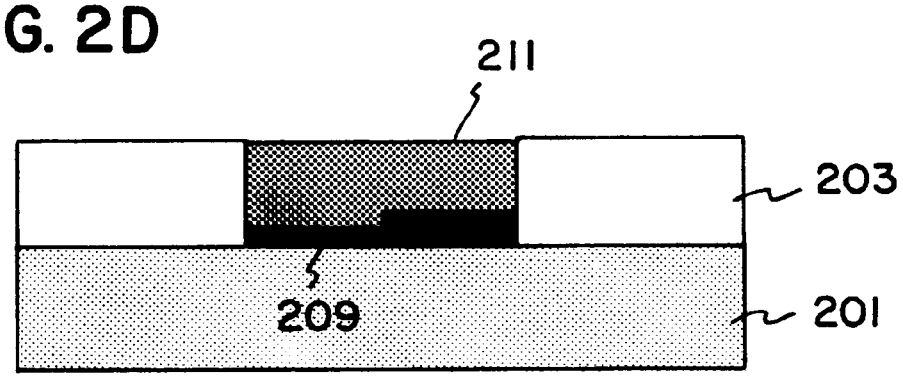

The mask 207 is removed and the portions 201a and 201b of the substrate 201 in the opening 205 are oxidized, as illustrated in FIG. 2C. The oxidation of the substrate 201 may be formed using a number of different techniques including, for example, conventional tube oxidation or rapid thermal anneal oxidation. This oxidation step generally forms an oxide over the substrate 201 in the opening 205. The oxide will be used as the gate dielectric 209 for a gate electrode. In the example embodiment, the gate dielectric 209 includes a nitrogen-bearing oxide portion 209a in substrate portion 201a where nitrogen was implanted, and a thicker, typically $SiO_2$ portion 209b in substrate portion 201b. The implanted nitrogen generally retards the oxidation rate of the substrate 201. As a result, the silicon dioxide region 209b generally has a thickness greater than the nitrogen-bearing oxide region 209a. The thickness differential may be, for example, about two.

The thickness of the two gate dielectric regions varies with the length of oxidation. Suitable thicknesses for the thin gate dielectric portion 209a range from about 10 to 20 Å and suitable thicknesses for the thicker gate dielectric region 209b range from about 20 to 40 Å for many applications.

Figure 2E:
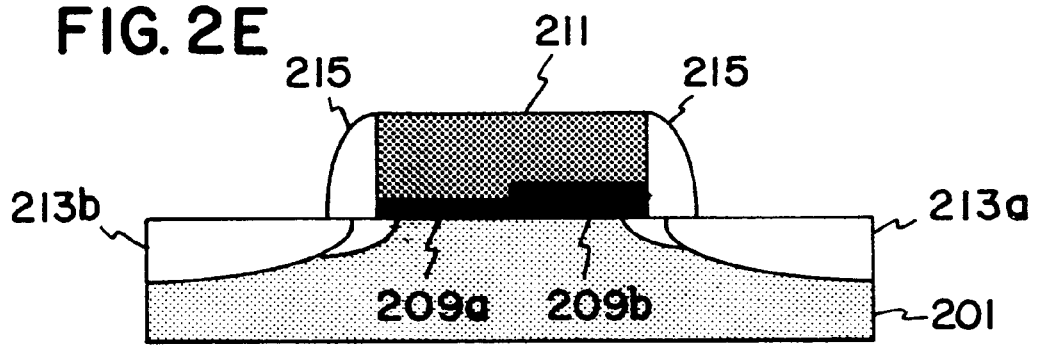

A gate electrode 211 is formed over the gate dielectric 209 in the opening 205, as illustrated in FIG. 2E. The gate electrode 211 may for example, be formed by forming a layer of gate electrode material over the substrate 201 and planarizing the upper surface of the gate electrode material with the upper surface of the masking layer 203. This may be done using, for example, well-known deposition and chemical-mechanical polishing techniques. The gate electrode 211 may be formed from a number of different materials including, for example, polysilicon or metal.

After formation of the gate electrode 211, the masking layer 203 is typically removed. Typically, the masking layer 203 is removed using techniques which leave the gate electrode stack (i.e., the gate electrode 211 and the gate dielectric 209) substantially intact. Suitable etching techniques include anisotropic etching techniques such as plasma techniques, for example. However, other etching techniques, such as wet etching techniques, could be used if desired.

Source/drain regions 213a and 213b are formed in regions of the substrate 201 adjacent the gate electrode 211. The source/drain regions 213a and 213b may, for example, be lightly doped drain (LDD) source/drain regions as illustrated. The LDD source/drain regions 213a and 213b may be formed, for example, by implanting a low dose of dopant (e.g., arsenic or boron) using the gate electrode 211 for alignment, forming spacers 215 on sidewalls of the gate electrode, and implanting a heavy dose of the same or similar type dopant into the substrate 201 using the spacers 215 for alignment. The implants and formation of the spacers 215 may be performed using, for example, well-known techniques. While LDD source-drain regions are illustrated, it should be appreciated that the invention is not so limited.

One of the source/drain regions 213a or 213b is typically used for the source and will typically be grounded, while the other will be used as the drain and connected to a voltage source of, for example, 1.5 to 3 or 5 volts. In an example embodiment, source/drain region 213a is used as the drain and source/drain region 213b is used as the source. This arrangement provides the thicker gate dielectric portion 209b at the drain and the thinner gate dielectric portion 209a at the source. The thicker gate dielectric on the drain side enhances device performance by, for example, reducing hot carrier injection effects. The thinner gate dielectric at the source increases device performance by increasing the operating speed of the device.

Using the above process, a semiconductor device having a dual gate dielectric thickness along the channel of the gate electrode can be fabricated. The use of a dual thickness gate dielectric can be used to optimize the performance of the transistor. For example, a thicker region of the gate dielectric may be disposed near the drain of the transistor to, for example, enhance transistor resistance to hot carrier injection effects. The thinner region of the gate dielectric may be disposed near the source of the transistor to, for example, increase the operating speed of the device. The present invention is not limited to this particular arrangement. In some circumstances, it may be desirable to use a thicker gate dielectric in conjunction with the source and a thinner gate dielectric in conjunction with the drain, depending on the characteristics of the transistor.

It should be appreciated that prior to formation of the masking layer 203, background implants, such as well implants, and voltage threshold implants may be performed to prepare the substrate for formation of the gate electrode stack. In alternate embodiments, channel implants, such as the voltage threshold implant, may be performed through the opening 205, for example, prior to forming the mask 207 and implanting the nitrogen-bearing species 209.

Figure 3A:
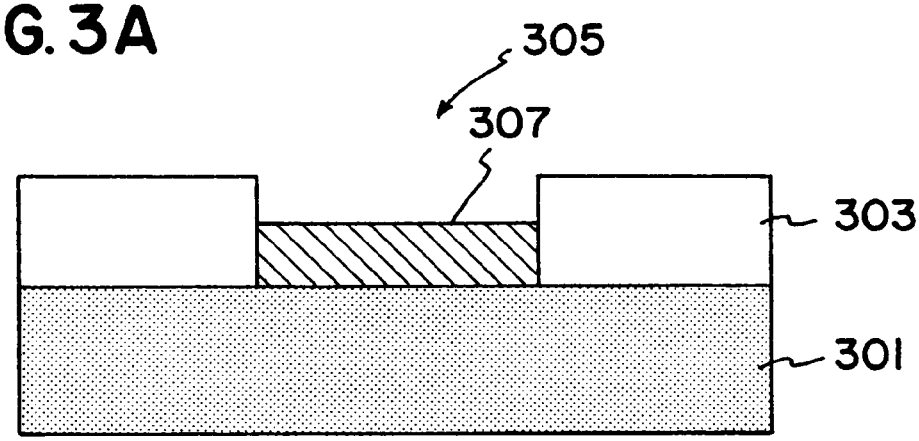
FIGS. 3A through 3C illustrate a fabrication process in accordance with another embodiment of the invention.
Figure 3B:
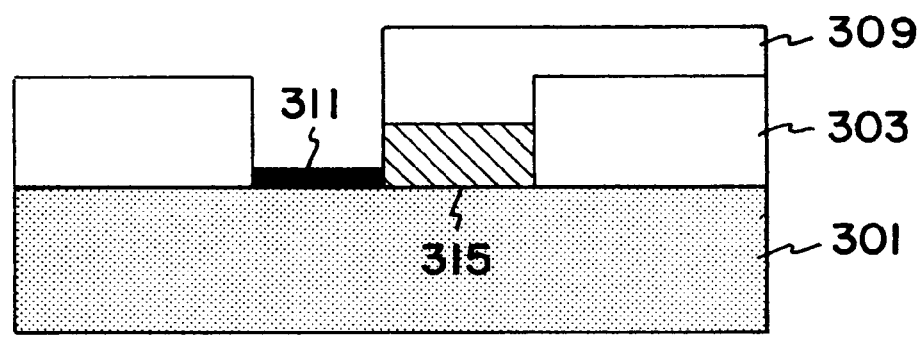
Figure 3C:
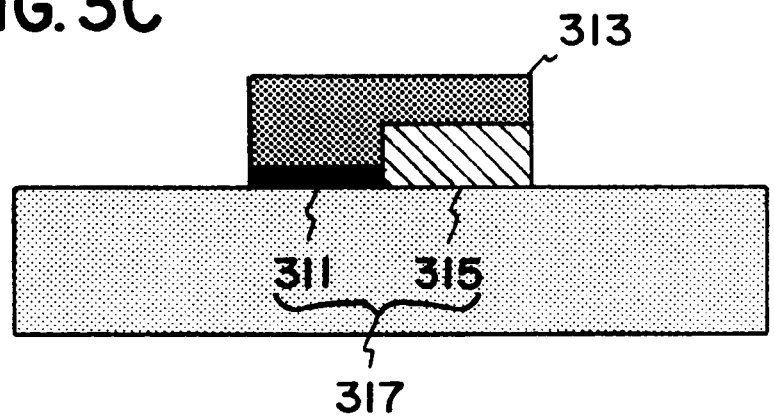

FIGS. 3A–3C illustrate another process for forming a gate dielectric having a dual thickness along the channel of the gate electrode. In accordance with the process, a masking layer 303 is formed over a substrate 301 and one or more openings (only one of which is shown) are formed in the masking layer 303. This may be done in a similar manner as discussed above with respect to FIG. 2A. A dielectric material 307 is then formed in the opening 305. The resultant structure is illustrated in FIG. 3A. The dielectric material 307 may be formed, for example, by depositing a layer of dielectric material over the substrate 301 and overpolishing the dielectric material to recess the dielectric material within the opening 305. This may be done using, for example, well-known deposition and chemical-mechanical polishing techniques.

A portion of the dielectric material 307 will be used a part of the gate dielectric for a gate electrode. The thickness of the dielectric material 307 is suitably selected in consideration of the desired separation of the gate electrode from the substrate 301, taking into account the dielectric constant of the dielectric material 307. Suitable dielectric materials include relatively high permittivity materials (i.e., having a higher dielectric constant than that of silicon dioxide, which has a dielectric constant of 4.2) such as barium strontium titanate, titanium oxide, and lead zinc titanate, for example. Suitable thicknesses of the dielectric material 307 range from about 100 to 2,000 Å for many applications.

A mask 309 is formed over the substrate 301 to selectively expose a portion of the dielectric material 307 and mask another portion of the dielectric material 307. The mask 309 may be formed using, for example, well-known photolithography techniques. The exposed portion of the dielectric material 307 is removed to typically expose the substrate 301. This may be done using, for example, well-known etching techniques. Typically, these etching techniques use etchants which remove the dielectric material 307 while leaving the masking layer 303 substantially intact. Suitable etching techniques include plasma etching, for example. The type of etchants used typically depends on the type of dielectric material 307 used.

The substrate 301 is oxidized to form an oxide layer 311 over the exposed portion of the substrate 301. The oxidation may be performed in a similar manner as discussed above. The oxide layer 311 will be used as part of the gate dielectric for the gate electrode. The thickness of the oxide layer 211 is suitably selected in consideration of the desired separation between the gate electrode and the substrate 301. Suitable thicknesses for the oxide layer 311 range from about 10 to 50 Å for many applications. The resultant structure is illustrated in FIG. 3B. Optionally, rather than oxidizing the substrate 301 a dielectric material different than dielectric material 315 may be deposited in the exposed portion of the substrate 301.

The mask 309 is removed using, for example, well-known etching techniques. A gate electrode 313 is then formed over the oxide layer 311 and remaining portion 315 of the dielectric material 307 and in the opening 305. This may be done in a similar manner as discussed above. After formation of the gate electrode 313, remaining portions of the masking layer 303 are removed. The remaining portions of the masking layer 303 may be removed in a similar manner as discussed above. The resultant structure illustrated in FIG. 3C includes a gate electrode 313 separated from the substrate 301 by a dual thickness gate dielectric 317. The gate dielectric 317 includes, in particular, a thin portion (e.g., oxide layer 311) and a thick portion (e.g., dielectric material 315). Fabrication may continue with well-known processes such as source/drain formation, silicidation, interconnect formations and so forth to complete the ultimate device structure. Source/drain formation may be done in a similar manner as discussed above.

The present invention is applicable to fabrication of a number of different devices where a dual gate dielectric along the channel and/or the associated advantages obtained therefrom are desired. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

We claim:

1. A process of forming a semiconductor device, comprising:

forming a gate dielectric having at least two regions of different thickness over the substrate; and forming a gate electrode over the gate dielectric;

wherein forming the gate dielectric includes:

forming a masking layer having an opening exposing a region of the substrate;

forming a first dielectric region in a first portion of the exposed region of the substrate; and forming a second dielectric region in a second region of the exposed region of the substrate, the second dielectric region being thicker than the first dielectric region.

2. A process of forming a semiconductor device, comprising:

forming a masking layer over a substrate, the masking layer having an opening exposing a region of the substrate;

forming a gate dielectric having at least two regions of different thickness in the opening and over the substrate; and forming a gate electrode over the gate dielectric.

3. The process of claim 1, wherein forming the masking layer includes depositing an oxide and removing a portion of the oxide to form the opening.

4. The process of claim 1, wherein forming the gate electrode includes depositing a gate electrode material in the opening and over the first dielectric and second dielectric regions.

5. The process of claim 4, further including removing the masking layer after forming the gate electrode.

6. The process of claim 5, wherein removing the masking layer includes etching the masking layer using anistotropic etching techniques.

7. The process of claim 5, further including forming source/drain regions adjacent the gate electrode after removing the masking layer.

8. The process of claim 1, wherein forming the first dielectric region and forming the second dielectric region includes:

forming a mask to mask the second portion of the exposed region of the substrate and leave unmasked the first portion of the exposed region of the substrate;

implanting a nitrogen-bearing species into the first portion of the exposed region of the substrate;

removing the mask; and oxidizing the exposed region of the substrate to form an oxide layer in the second portion of the exposed region of the substrate and a nitrogen-bearing oxide layer in the first portion of the exposed region of the substrate.

9. The process of claim 1, wherein forming the first dielectric region and forming the second dielectric region includes:

forming a dielectric material in the opening;

selectively removing the dielectric material from the first portion of the exposed region of the substrate to leave a remaining portion of the dielectric material in the second region of the exposed region of the substrate; and oxidizing the first portion of the substrate after selectively removing the dielectric material from the first portion of the exposed region of the substrate to form an oxide layer in the first portion of the exposed region of the substrate;

wherein the oxide layer forms the first gate dielectric region and the remaining portion of the dielectric material forms the second gate dielectric region.

10. The process of claim 1, further including forming a source region adjacent the first dielectric region and a drain region adjacent the second, thicker dielectric region.

11. The process of claim 2, wherein forming the gate electrode includes forming the gate electrode in the opening.

12. The process of claim 11, wherein forming the gate electrode includes depositing a gate electrode material over the masking layer and in the opening and polishing the gate electrode material to form the gate electrode in the opening.

13. The process of claim 12, further including selectively removing the masking layer while leaving the gate electrode.

14. The process of claim 13, further including forming active regions adjacent the gate electrode after removing the masking layer.

15. The process of claim 2, wherein forming the gate dielectric in the opening includes:

forming a mask to expose a first part of the substrate region defined by the opening and cover a second part of the substrate region;

implanting a nitrogen-bearing species into the exposed first part of the substrate region;

removing the mask after implanting the nitrogen-bearing species; and oxidizing the region of the substrate defined by the opening in the masking layer to form an oxide layer over the second part of the exposed region and a nitrogen-bearing oxide layer over the first part of the exposed region of the substrate.

16. The process of claim 2, wherein forming the gate dielectric in the opening includes:

forming a first dielectric material in the opening;

forming a mask to cover a first part of the opening and expose a second part of the opening;

removing the first dielectric material in the first part and leaving the first dielectric material in the second part; and forming a second dielectric material over the substrate in the first part after removing the first dielectric material wherein the second dielectric material and the remaining first dielectric material form the at least two regions of different thickness.

* * * * *